United States Patent [19]

Moritsu et al.

[11]  4,150,995
[45]  Apr. 24, 1979

[54] VITREOUS ENAMEL COMPOSITION CONTAINING PALLADIUM POWDER

[75] Inventors: Yukikazu Moritsu, Nishinomiya; Kooji Yamada, Kashihara; Masatoshi Wada, Izumiotsu; Eiji Munemoto, Hirakata, all of Japan

[73] Assignee: Okuno Chemical Industry Co., Ltd., Japan

[21] Appl. No.: 854,397

[22] Filed: Nov. 23, 1977

[51] Int. Cl.² .......................... C23C 3/02; C03C 5/00; C03C 17/04
[52] U.S. Cl. .................................. 106/1.21; 106/1.11; 106/49; 252/514; 427/190; 427/193; 427/205; 427/229; 427/304; 427/383 B
[58] Field of Search ................... 106/1.11, 1.21, 49; 427/304, 190, 193, 205, 229, 383 B; 252/514

[56] References Cited
U.S. PATENT DOCUMENTS 3,374,110  3/1968  Miller .................................. 106/1.21
3,537,892  11/1970  Milkovich et al. ................. 106/1.21
3,772,075  11/1973  Tarnopol et al. ................... 106/1.11

FOREIGN PATENT DOCUMENTS 14829  1972  Japan.
5771  1973  Japan.

OTHER PUBLICATIONS

"Plating of Plastic Articles", pp. 85, 87.

Primary Examiner—John D. Smith
Attorney, Agent, or Firm—Marmstrong, Nikaido, Marmelstein & Kubovcik

[57] ABSTRACT

A vitreous enamel composition comprising 1 part by weight of a vitreous enamel solid component composed of (1) 90–99.9 wt. % of glass powder consisting of 30 to 70 wt. % of $SiO_2$, 1–65 wt. % of PbO, and 1–15 wt. % of $R_2O$ in which R is K, Na or Li, and (2) 0.1–10 wt. % of palladium powder, and 1–20 parts by weight of an organic vehicle.

7 Claims, No Drawings

VITREOUS ENAMEL COMPOSITION CONTAINING PALLADIUM POWDER

This invention relates to vitreous enamel compositions, and more particularly to vitreous enamel compositions for undercoating the glass and ceramic articles to be electrolessly plated.

Generally the surface of glass and ceramic articles can not be coated by electroless plating when subjected directly thereto. It is therefore necessary to deposit on the surface of such an article palladium, silver, gold or a derivative thereof to sensitize the surface for electroless plating. The sensitizing substance must be deposited on the surface with high adhesion and as uniformly as possible free of local irregularities. Additionally the layer of the sensitizing material should preferably be rough-surfaced to the greatest possible extent.

The surface of glass and ceramic articles is usually sensitized by applying a sensitizing material directly to the surface (to be hereinafter referred to as "direct catalyzing method"), by applying a silver paste composed of a small amount of silver powder and an organic vehicle in not more than one half the amount (by weight) of the silver and firing the resulting coating (to be hereinafter referred to as "silver past firing method"), and by applying a vitreous enamel composition composed of lead glass, an organic acid salt of sensitizing material and a small amount of organic vehicle, followed by firing (to be hereinafter referred to as "glass enamel firing method").

With the direct catalyzing method, the adhesion between the sensitizing material and the surface of the article is very low, rendering the electroless coating adhered to the article only with very low strength. According to the silver paste firing method, the electroless plating is limited only to copper plating which requires the use of large quantities of expensive silver, hence commercially very disadvantageous. The vitreous enamel firing method has the following drawbacks. Since the glass component used is lead glass which is low melting, there is an extreme limitation on the range of adjustable temperatures for forming on the surface of ceramic articles a fired layer in which the lead glass retains its particulate form. Frequently, therefore, the glass particles per se are fused, giving a smooth-surfaced vitreous layer instead of forming a porous rough surface. Moreover the glass tends to cover the sensitizing material, rendering the material less exposed, with the result that the electroless coating, if formed, will have reduced adhesion thereto.

An object of this invention is to provide a vitreous enamel composition capable of giving coatings on which platings can be formed with outstanding adhesion.

Another object of this invention is to provide a vitreous enamel composition which permits electroless deposition of nickel, cobalt and other metals as well as copper.

These and other objects of this invention will become apparent from the following description.

The vitreous enamel composition of this invention is characterized in that the composition comprises: 1 part by weight of a vitreous enamel solid component composed of (1) 90–99.9 wt. % of glass powder consisting of 30–70 wt. % of $SiO_2$, 1–65 wt. % of PbO, and 1–15 wt. % of $R_2O$ in which R is K, Na or Li, and (2) 0.1–10 wt. % of palladium powder, and 1–20 parts by weight of an organic vehicle admixed with the solid component.

According to this invention it is essential that the vitreous enamel composition contain a glass powder consisting of 30–70 wt. % of $SiO_2$, 1–65 wt. % of PbO, and 1–15 wt. % of $R_2O$ in which R is as defined above. The glass powder of this invention, although containing lead component, can overcome the above drawbackes of the prior lead glass, since the glass powder of this invention is composed of $SiO_2$, PbO and $R_2O$ in the specified proportions disclosed above. More specially, the powder can be fired at temperatures in a wider range than lead glass, while retaining the form of glass powder, giving a porous layer of fired glass powder on glass or ceramic articles. Since the glass powder is fired on the surface of the ceramic article, the vitreous layer can be formed as adhered thereto with high bond strength.

In this invention, the glass powder of the above composition is used conjointly with the organic vehicle in an amount of 1 to 20 times the amount by weight of the powder, the amount of the vehicle being exceedingly greater than was conventionally used in vitreous enamel compositions of this type. Consequently, a rough-surfaced layer of the glass powder can be formed uniformly on the surface of glass and ceramic articles.

The glass powder of this invention is composed preferably of 35–65 wt. % of $SiO_2$, 10–60 wt. % of PbO and 3–15 wt. % of $R_2O$. The composition of the glass powder is determined based mainly on the melting temperature of the glass powder, the temperature range in which the powder can be fired, the adhering properties and strength of the fired layer obtained. With less than 30 wt. % of $SiO_2$ present, the fired vitreous layer is liable to corrosion by the plating bath, with the result that the subsequent plating process gives metal coatings of reduced bond strength. With more than 70 wt. % of $SiO_2$ present, too high a firing temperature (melting temperature) will be required, adversely affecting the glass or ceramic article per se and producing a tendency to reduce the catalytic properties of the palladium powder. Further if the amount of PbO is less than 1 wt. %, difficulty is likely to arise in melting the glass powder. Conversely if it is more than 65 wt. %, the resulting vitreous layer will have a reduced chemical stability and become susceptible to corrosion by the plating bath and impossible to form an electroless plating layer. Further if $R_2O$ is present in an amount of less than 1 wt. %, difficulty is likely to take place in melting the glass powder. With use of more than 15 wt. % of $R_2O$, a reduced chemical stability and increased susceptibility to corrosion by the plating bath will result.

Insofar as the above components are used within the ranges defined above, at least one or two of BaO, $B_2O_3$, CaO, MgO, NaF, ZnO, $TiO_2$, $ZrO_2$, $SnO_2$, $Al_2O_3$, $Bi_2O_3$ and $Fe_2O_3$ can be used in an amount of up to 20 wt. % in this invention. Among these components, $B_2O_3$, CaO, BaO and MgO act to promote vitrification, while NaF serves to adjust the melting temperature of the glass powder. ZnO, $TiO_2$, $SnO_2$, $ZrO_2$, $Al_2O_3$, $Fe_2O_3$, etc. are effective in giving an improved chemical stability to the glass powder.

The glass powder can be produced according to the usual method. For example, a vitreous mixture of the above composition is melted in the usual manner at 1000°–1500° C for 1–6 hours and the molten mass is quenched in water and thereafter mechanically treated in a ball mill or the like. The resulting slurry is dried to obtain a cake, which is then pulverized by suitable means such as oscillating screen. The glass powder of this invention is usually 0.5 to 20 μ, more particularly 0.5 to 10 μ in particle size.

According to this invention, a palladium powder is admixed with the glass powder to obtain a vitreous enamel solid component. Useful palladium powders are finely divided metal palladium and inorganic compounds thereof, such as palladium oxide, palladium hydroxide, palladium black, etc. Palladium oxide is prepared by the usual manner, for example palladium chloride is heated with sodium nitrate at a temperature of about 600° C. Palladium hydroxide is produced by adding an aqueous solution of palladium chloride to sodium hydroxide to precipitate palladium hydroxide, removing the resulting precipitate and drying the precipitate removed. Further palladium black is prepared by dissolving palladium chloride in an aqueous solution of hydrochloric acid, adding formalin to the solution, adjusting the resulting solution to a pH of more than 7, heating the resulting alkaline solution at a temperature of 50 to 80° C. for several hours to precipitate palladium black and separating the palladium black from the solution, followed by washing with water and drying. These palladium powders are used in an amount of 0.1-10 wt. %, preferably 1-8 wt. %, based on the vitreous enamel solid component. If the proportion of the palladium powder is less than 0.1 wt. %, it is difficult to permit the formation of platings, whereas even if it is in excess of 10 wt. %, further improved results will not be achievable. The method of mixing the glass powder with the palladium powder is not particularly limited but a wide variety of methods are employable. Typically, the powders are mixed together in a mortar for at least 3 hours.

The vitreous enamel composition of this invention is prepared by diluting the glass enamel solid component with an organic vehicle in an amount of 1 to 20 times, preferably 1 to 10 times the solid component. Useful organic vehicles are those which can be evaporated off on decomposition when the vitreous enamel composition is fired. Examples are organic solvents, the mixture of water and organic solvents, and solutions or dispersions or resins in water or such solvents. Examples of organic solvents are terpene, esters, ethers, aromatic hydrocarbons, more particularly pine oil, turpentine oil, diethylene glycol monobutyl ether, ethylene glycol monobutyl ether, amyl acetate, toluene, xylene, etc. Examples of useful resins are natural and synthetic resins. Examples of useful natural resins are balsam, gum damar, copal, rosin, etc. Examples of useful synthetic resins are cellulose resin, acrylic resin, polyamide, polyester, polyvinyl acetate, polyethylene glycol, polyvinyl acetal, polyvinyl alcohol, etc. Examples of aqueous solutions or dispersions are aqueous solutions of polyvinyl alcohol, polyvinyl acetate emulsion, acryl emulsion. Also usable are organic solvent solutions or dispersions of various resins. Typical of organic vehicles are a mixture of 76 wt. % of pine oil, 6 wt. % of polyester resin (trademark; "Barnok D-161," product of Dainippon Ink and Chemicals, INC., Japan), 12 wt. % of cellulose resin (trademark; "EC-N-22," product of Hercules, U.S.A.) and 6 wt. % of polyvinyl resin (trademark: "Eslec BL-1," terpolymer of vinyl butyral, vinyl acetate and vinyl alcohol, manufactured by Sekisui Chemical Co., Japan), a mixture of 96 wt. % of pine oil and 4 wt. % of the above-mentioned cellulose resin. These vehicles are useful for preparing the vitreous enamel compositions of this invention in the form of a paste. A vehicle composed of 15 wt. % of the cellulose resin and 85 wt. % of isopropyl alcohol is well suited to the preparation of the present composition adapted for coating. Paste-like thermoplastic compositions amenable to screen printing can be prepared with use of wax-like vehicles composed of 40-60 wt. % of stearyl or cetyl alcohol and 60-40 wt. % of thermoplastic resin, such as a wax-like mixture of 40 wt. % of stearyl alcohol, 5 wt. % of polyethylene glycol (trademark: "PEG-1540," product of Sanyo Chemical Industries Co., Japan), 2 wt. % of cellulose resin ("EC-N-22"), 3 wt. % of acrylic resin (trademark: "Acrybase BM-2003," product of Fujikura Kasei Co., Japan), and 50 wt. % of corn starch.

According to this invention, a substance which will not melt during the firing of the composition can be incorporated into the composition in an amount of 1-20 wt. % based on the composition. Examples of such substances are barium sulfate, calcium sulfate kaolin, feldspar, siliceous sand, alumina, etc. The time when to add the substance is not particularly limited; for example, it may be added to the glass powder; or to the organic vehicle and the vitreous enamel solid component when the latter two are mixed together.

The vitreous enamel compositions of this invention are applicable to glass and ceramic articles by any of various usual methods. When the composition is in the form of a paste, the desired design is printed through an appropriate screen on the surface of glass and ceramic articles. Compositions adapted for coating are applied to the desired surface portion of articles by the usual method as by spraying or immersion. With compositions adapted for use with transfer paper, the design of the decalcomania can be transferred as it is. The vitreous enamel composition applied to the glass or ceramic article is then fired in the usual manner. The firing conditions are determined as desired in accordance with the composition of the vitreous enamel composition and the kind of the glass or ceramic article. Usually the firing is conducted at 450° to 850° C. for about 2 to about 30 minutes. The firing step causes the organic vehicle component to evaporate off upon decomposition, forming a layer of the glass powder containing the palladium powder on the surface of the article. Subsequently, the article is subjected to an electroless plating process in the usual manner, whereby a metal plating is formed on the glass powder layer. Prior to the electroless plating, the article can be pretreated in a simple usual manner as by being immersed in about 1-20% aqueous solution of hydrochloric acid at room temperature to about 60° C. for about 2 to about 30 minutes. For the electroless plating, a wide variety of baths are usable, typical of which are an acid or alkaline electroless nickel plating bath containing sodium hypophosphite an electroless nickel or copper plating bath containing sodium boron hydride or like boron-type reducing agent, other usual electroless gold, silver, brass and cobalt plating baths, etc.

The vitreous enamel compositions of this invention are applicable to a wide variety of glass and ceramic articles which remain stable at the firing temperature, such as articles made of soda lime silica glass, borosilicate glass or like glass, various ceramic articles, ferites semiconductors, alumina plates etc.

The vitreous enamel compositions of this invention are readily applicable to glass and ceramic articles over the entire surface or desired portion thereof by any of the usual methods such as ordinary screen printing, transfer printing, spraying or like coating method, depending on the kind and proportion of the organic vehicle used in the composition. The composition applied to the article can be fired with ease without entailing deformation of the article itself, forming a layer with a very porous surface on which the palladium powders, i.e. the sensitizing material, are uniformly distributed as exposed over the entire surface area. Since the vitreous enamel compositions of this invention, when applied to glass or ceramic articles and fired in the usual manner, give a highly sensitized porous vitreous layer on the article integral therewith, a uniform plating of metal such as copper, nickel, cobalt, gold, silver or the like can be subsequently electrolessly formed on the article with high adhesion due to the resulting anchorage and chemical bond between the sensitizing material and the plated metal.

Thus the present invention is very useful in forming on glass and ceramic articles decorative or colored metal coatings with high durability. The vitreous enamel compositions of this invention are useful also for glazing glassware and ceramic ware because of their outstanding resistance to acids and alkalis.

This invention will be described below with reference to examples, in which the percentages are all by weight.

EXAMPLE 1

A vitreous mixture of the following composition is prepared.

|  | % |
|---|---|
| PbO | 47 |
| $SiO_2$ | 36 |
| $Na_2O$ | 4 |
| $Li_2O$ | 2.5 |
| $B_2O_3$ | 4 |
| $ZrO_2$ | 4.5 |
| $TiO_2$ | 2 |

The mixture is fused at 1250° C. for 1 hour in an oil furnace and then quenched in water to obtain a vitreous frit. The wet frit is ground in a pot mill for 4 days to prepare a slurry, which is dried and thereafter comminuted on a 200-mesh oscillating screen to obtain a glass powder according to this invention. The glass powder has a coefficient of expansion of $82.7 \times 10^{-7}$ cm/cm/° C. and particle-size distribution of: 38.9% of smaller than 2 $\mu$, 42.0% of 2–4 $\mu$, 16.9% of 4–6 $\mu$, 2.1% of 6–7 $\mu$, and 0.1% of larger than 7 $\mu$.

On the other hand, palladium chloride is dissolved in an aqueous solution of hydrochloric acid, formalin is added to the solution, and the resulting solution is adjusted to a pH of about 8 with sodium hydroxide. The solution is heated at 60° C. for 1 hour, and the palladium black separated out is filtered off, washed with water and spontaneously dried to obtain a palladium powder.

A 960 g portion of the glass powder and a 40 g portion of the palladium powder obtained as above are mixed together in a mortar for 10 hours. An oil serving as an organic vehicle and composed of 76% of pine oil, 12% of cellulose resin (trademark: "EC-N-22," product of Hercules INC.) 6.0% of polyester (trademark: "Barnok D-161") and 6.0% of polyvinyl resion (trademark: "Eslec BL-1") is added to the mixture in five times the amount by weight of the solids of the mixture. The resulting mixture is kneaded for 5 hours, and the paste obtained is further treated with three rollers to prepare a uniform vitreous enamel composition of this invention.

The vitreous enamel composition is printed, in an amount of 0.005 g/cm², on a soda-lime-silica glass plate through a 180-mesh screen. The printed plate is placed into a box furnace the internal temperature of which is thereafter raised at a rate of 40° C./min. The composition is fired at 540° ± 10° C. for 15 minutes.

The vitreous enamel test piece thus prepared is immersed in a 5% solution of hydrochloric acid at 50° C. for 5 minutes and then in a 5% solution of soda hypophosphite at 60° C. for 10 minutes for pre-treatment and is subsequently electrolessly plated in an electroless plating bath composed of 100 ml of "A-type Chemical Copper Plating Solution #100" (product of Okuno Chemical Industry Co.), 100 ml of "B-type Chemical Plating Solution #100)" (product of the same company) and 400 ml of water at 25° C. for 15 minutes to form a uniform copper plating on the test piece. The resulting test piece is checked for its bond strength according to the following manner.

One hundred squares, 1mm × 1mm, are formed in the plating layer on the test piece by the cross cutting which reaches the surface of the glass plate, adhesive tape is adhered to the cut layer and then pealed off quickly, and the number of the squares remaining on the test piece is counted to determine the bond strength. The result is 100/100

EXAMPLE 2

A vitreous mixture of the following composition is prepared.

|  | % |
|---|---|
| $SiO_2$ | 36 |
| PbO | 47 |
| $Na_2O$ | 4 |
| $Li_2O$ | 2.5 |
| $B_2O_3$ | 4 |
| $ZrO_2$ | 4.5 |
| $TiO_2$ | 2 |

The mixture is fused at 1250° C. in an oil furnace and then quenched in water to obtain a vitreous frit. The wet frit is ground in a pot mill for 4 days to prepare a slurry, which is dried and thereafter comminuted on a 200-mesh C./min. screen to obtain a glass powder according to this C. C.

The glass powder and the palladium powder obtained in Example 1 are mixed together in the specified proportions shown in Table 1. The organic vehicle disclosed below is added to the mixture in three times the amount by weight of the solids of the mixture, and the resulting mixture is kneaded for 5 hours to obtain vitreous enamel compositions.

| Organic vehicle : | % |
|---|---|
| Pine oil | 76 |
| Cellulose resin as shown in Example 1 | 12 |
| Polyvinylacetal | 6 |
| ("Eslec BL-1" product of Sekisui Chemical Co.) | |
| Polyester | 6 |
| ("Barnok D-161) | |

The vitreous enamel composition is printed, in an amount of 0.005 g/cm², on a soda-lime-silica glass plate through a 200-mesh screen. The printed plate is placed into an electric resistor furnace the internal temperature of which is thereafter raised at a rate of 30° C/min. The composition is fired at 550° C ± 10° C for 10 minutes.

The vitreous enamel test piece thus prepared is immersed in a 10% solution of hydrochloric acid at 50° C. for 15 minutes and then in a 20% solution of soda hypophosphite at 85° C. for 5 minutes for pre-treatment and is subsequently electrolessly plated in the same plating bath as in Example 1 at 25° C. for 15 minutes to form a copper plating on the test piece.

The resulting test piece is checked for the following plating properties. The results are shown in Table 1 below.

Table 1

| No. | | 1 | 2 | 3 | 4 | 5 |
|---|---|---|---|---|---|---|
| Proportions of glass powder and palladium powder (%) | glass powder | 99.95 | 99.8 | 95 | 90 | 87 |
| | palladium powder | 0.05 | 0.2 | 5 | 10 | 13 |
| Plated area (%) | | 10 | | 100 | 100 | 100 | 100 |
| Bond strength (Kg/mm$^2$) | | 0.4 | | 1.0 | 1.5 | 1.5 | 1.5 |

The bond strength is measured by soldering a copper wire 0.5 mm in diameter to the copper plating and pulling the copper wire at right angle to the plate on a tension tester (product of Shimazu Seisakusho Co., Ltd., Japan).

EXAMPLE 3

A vitreous mixture of the following composition is prepared.

| | % |
|---|---|
| $SiO_2$ | 50 |
| PbO | 25 |
| $B_2O_3$ | 7 |
| $ZrO_2$ | 5 |
| $Na_2O$ | 8 |
| $K_2O$ | 5 |

The mixture is fused at 1250° C. in an oil furnace and then quenched in water to obtain a vitreous frit. The wet frit is ground in a pot mill for 4 days to prepare a slurry, which is dried and thereafter comminuted on a 200-mesh oscillating screen to obtain a glass powder according to this invention.

84 Parts by weight of the glass powder, 10 parts by weight of feldspar and 6 parts by weight of palladium oxide are mixed together in a mortar for 5 hours. The same organic vehicle as in Example 2 is added to the mixture in the specified proportions disclosed in Table 2 and the resulting mixture is kneaded for 5 hours to obtain a vitreous enamel composition.

The vitreous enamel composition is printed in an amount of 0.005 g/cm$^2$, on a sintered pure alumina plate through a 300-mesh screen. The printed plate is placed into an electric resistor furnace the internal temperature of which is thereafter raised at a rate of 30° C./min. The composition is fired at 660° ± 10° C. for 10 minutes.

The vitreous enamel test piece thus prepared is immersed in a 10% solution of hydrochloric acid at 50° C. for 15 minutes for pre-treatment and subsequently electrolessly plated in an electroless plating bath ("Acid type Chemical Nickel Plating Solution MU," product of Okuno Chemical Industry Co.) at 90° C. for 15 minutes.

The resulting piece thus plated is checked for the following plating properties. The results are given in Table 2 below.

Table 2

| No. | 1 | 2 | 3 | 4 | 5 |
|---|---|---|---|---|---|
| Proportions of solid component and organic vehicle | 1/0.2 | 1/2 | 1/7 | 1/15 | 1/25 |
| Plated area (%) | 5 | 100 | 100 | 100 | 40 |
| Bond strength (Kg/mm$^2$) | 0.05 | 1.7 | 1.6 | 1.0 | 0.05 |

What is claimed is:

1. A vitreous enamel composition comprising 1 part by weight of a vitreous enamel solid component composed of (1) 90-99.9 wt. % of glass powder consisting of 30 to 70 wt. % of $SiO_2$, 1-65 wt. % of PbO, and 1-15 wt. % of $R_2O$ in which R is K, Na or Li, and (2) 0.1-10 wt. % of palladium powder, and 3-20 parts by weight of an organic vehicle.

2. The vitreous enamel composition according to claim 1, in which said glass powder consists of 35-65 wt. % of $SiO_2$, 10-60 wt. % of PbO, and 3-15 wt. % of $R_2O$ in which R is K, Na or Li.

3. The vitreous enamel composition according to claim 1, in which said glass further contains at least one of $B_2O_3$, CaO, BaO, MgO, NaF, ZnO, $TiO_2$, $ZrO_2$, $SnO_2$, $Al_2O_3$, $Bi_2O_3$ and $Fe_2O_3$ in an amount of up to 20 wt. % based on the glass powder.

4. The vitreous enamel composition according to claim 1, in which said vitreous enamel solid component one of composed of (1) 92-99 wt. % of glass powder consisting of 30 to 70 wt. % of $SiO_2$, 1-65 wt. % of PbO, and 1-15 wt. % of $R_2O$ in which R is K, Na or Li, and (2) 1 to 8 wt. % of palladium powder.

5. The vitreous enamel composition according to claim 1, in which said organic vehicle is contained in an amount of 3-10 parts by weight based on 1 part by weight of the vitreous enamel solid component.

6. The vitreous enamel composition according to claim 1 which further contains at least one of substances not melting during firing the composition.

7. The vitreous enamel composition according to claim 6, in which said substance is at least of barium sulfate, calcium sulfate, kaolin, feldspar, siliceous sand and alumina.

* * * * *